US012567117B2

(12) United States Patent
Pandharpure et al.

(10) Patent No.: US 12,567,117 B2
(45) Date of Patent: Mar. 3, 2026

(54) INTELLIGENT ELECTRIC METER

(71) Applicant: EATON INTELLIGENT POWER LIMITED, Dublin (IE)

(72) Inventors: Amar Pandharpure, Pune (IN); Meghan Saitwal, Aurangabad (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 838 days.

(21) Appl. No.: 17/030,851

(22) Filed: Sep. 24, 2020

(65) Prior Publication Data

US 2022/0092707 A1      Mar. 24, 2022

(51) Int. Cl.
H02J 13/00          (2006.01)
G01R 19/25          (2006.01)
G01R 22/06          (2006.01)
G01R 22/10          (2006.01)
G06F 11/30          (2006.01)
G06Q 30/04          (2012.01)
G06Q 50/06          (2012.01)

(52) U.S. Cl.
CPC .......... *G06Q 50/06* (2013.01); *G01R 22/063* (2013.01); *G01R 22/10* (2013.01); *G06Q 30/04* (2013.01)

(58) Field of Classification Search
CPC ....... G06Q 50/06; G06Q 30/04; G01R 22/063
See application file for complete search history.

(56) References Cited

U.S. PATENT DOCUMENTS 10,060,957 B2 *    8/2018   Curt ....................... G01D 9/005
2003/0193405 A1 *  10/2003  Hunt ...................... G01D 4/008
                                                           340/870.11

(Continued)

FOREIGN PATENT DOCUMENTS

CN          103852608 A        6/2014
CN          205720336 U       11/2016

(Continued)

OTHER PUBLICATIONS

European Patent Office "International Search Report and Written Opinion", from corresponding International Application No. PCT/EP21/025345, dated Dec. 20, 2021, 15 pp.

(Continued)

*Primary Examiner* — Talia F Crawley
(74) *Attorney, Agent, or Firm* — Eckert Seamans Cherin & Mellott, LLC

(57)          ABSTRACT
An intelligent electric meter includes metering components for measuring energy consumption by one or more devices used by a customer in a building, a controller electrically coupled to the metering components and structured to control operations of the metering components and receive energy consumption data based on the measured energy consumption from metering components, a software device electrically coupled to the controller and structured to instruct the controller to monitor the energy consumption data, calculate energy consumption charges for the customer based at least in part on the energy consumption data, and generate a bill and energy usage data for a predefined period, and a communication device electrically coupled to the controller and the software device and structured to transmit the bill and energy usage data to the customer via a defined communications channel.

11 Claims, 5 Drawing Sheets

(56)                References Cited

U.S. PATENT DOCUMENTS

| | | | |
|---|---|---|---|
| 2004/0243524 A1 | 12/2004 | Crichlow | |
| 2008/0177678 A1 | 7/2008 | Di Martini et al. | |
| 2010/0134089 A1* | 6/2010 | Uram | G01R 29/18 |
| | | | 324/142 |
| 2011/0050454 A1* | 3/2011 | Luis Sanchez | G01D 4/002 |
| | | | 340/870.01 |
| 2012/0226605 A1 | 9/2012 | Veerubhotla | |
| 2014/0203948 A1* | 7/2014 | Raskar | H04Q 9/00 |
| | | | 340/870.02 |
| 2015/0046704 A1* | 2/2015 | Liang | H04L 9/0816 |
| | | | 713/162 |
| 2015/0241896 A1* | 8/2015 | Nishibayashi | G05B 15/02 |
| | | | 700/286 |
| 2016/0072288 A1* | 3/2016 | Debone | G06Q 10/06 |
| | | | 700/295 |
| 2018/0025458 A1* | 1/2018 | Swamy | G01S 5/0027 |
| | | | 705/7.26 |
| 2019/0265661 A1* | 8/2019 | Sakellariadis | G06F 16/951 |
| 2019/0372798 A1 | 12/2019 | Soya et al. | |
| 2019/0392328 A1* | 12/2019 | Gil Bulacio | H04L 67/12 |
| 2020/0064153 A1* | 2/2020 | Kagan | H04L 67/55 |
| 2020/0196313 A1* | 6/2020 | Tao | H04W 72/51 |
| 2020/0273024 A1* | 8/2020 | Gorilovsky | G06Q 20/085 |
| 2022/0190641 A1* | 6/2022 | Decker | G01R 22/063 |
| 2022/0337416 A1* | 10/2022 | Stoussavljewitsch | |
| | | | H04L 9/3239 |

FOREIGN PATENT DOCUMENTS

| | | |
|---|---|---|
| CN | 106842991 A | 6/2017 |
| CN | 107093069 A | 8/2017 |
| KR | 20120100775 A | 9/2012 |
| WO | 2012/004597 A2 | 1/2012 |

OTHER PUBLICATIONS

Journal of Minjiang University, "Research on the Selection of Fee Control Modes for Smart Electricity Meters", vol. 34 No. 1, Jan. 2013, 4 pp. No translation available.

China National Intellectual Property Administration "First Office Action" (includes English translation) for corresponding Chinese Patent Appl. No. 202180053069.9, dated Jul. 4, 2025, 27 pp.

* cited by examiner

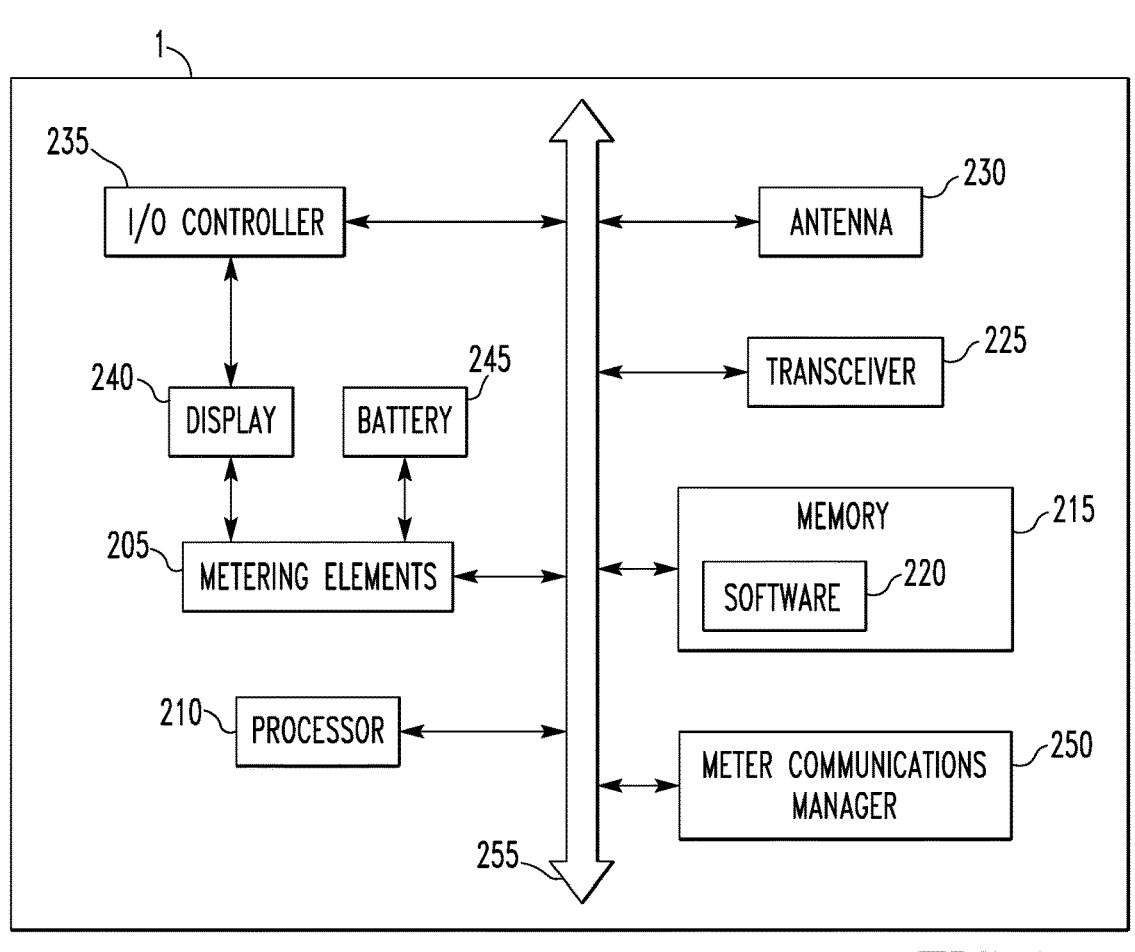

FIG.4

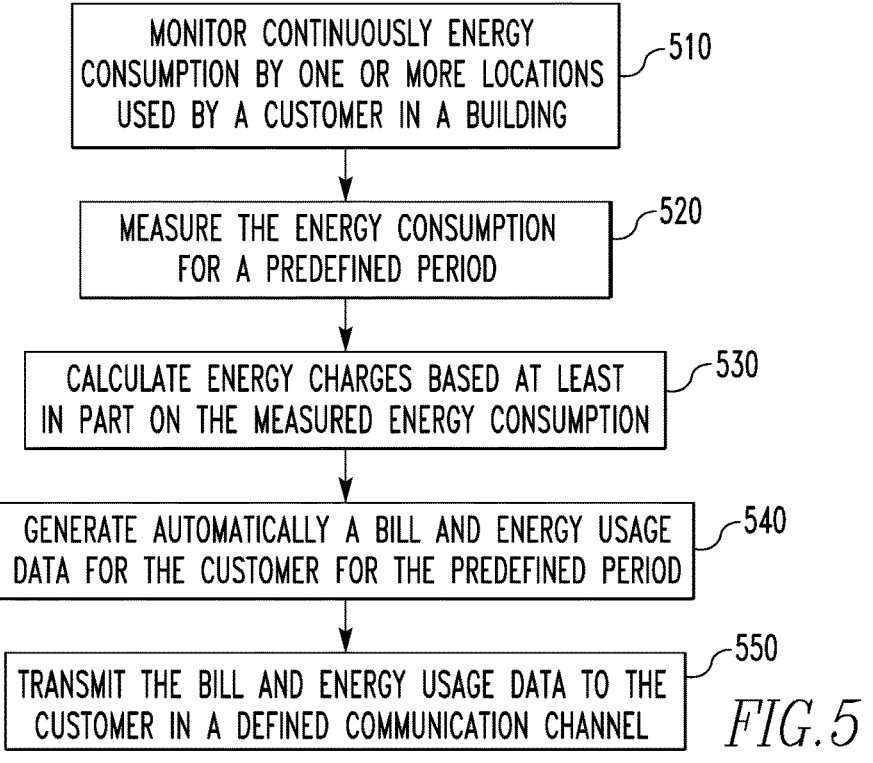

MONITOR CONTINUOUSLY ENERGY CONSUMPTION BY ONE OR MORE LOCATIONS USED BY A CUSTOMER IN A BUILDING — 510

MEASURE THE ENERGY CONSUMPTION FOR A PREDEFINED PERIOD — 520

CALCULATE ENERGY CHARGES BASED AT LEAST IN PART ON THE MEASURED ENERGY CONSUMPTION — 530

GENERATE AUTOMATICALLY A BILL AND ENERGY USAGE DATA FOR THE CUSTOMER FOR THE PREDEFINED PERIOD — 540

TRANSMIT THE BILL AND ENERGY USAGE DATA TO THE CUSTOMER IN A DEFINED COMMUNICATION CHANNEL — 550

FIG.5

INTELLIGENT ELECTRIC METER

BACKGROUND OF THE INVENTION

Field of the Invention

The disclosed concept relates generally to an electric meter, and in particular, to an intelligent electric meter capable of measuring energy consumption and automatically generating a bill and energy usage data for a predefined period.

Background Information

An electric meter measures energy consumption by a home, an office, a plant, a factory, a facility or any device consuming energy. Conventionally, an inspector or agent (e.g., from a building owner, a building management company, a utility provider, etc.) visits homes, offices, plants, factories or facilities to read the electric meter which measures energy consumption of one or more locations or specified areas used by a customer tied to that electric meter. Upon obtaining energy consumption data from the electric meter, the inspector or agent returns to his or her office, and enters the energy consumption data into a system, e.g., a cloud system, which generates a bill for the customer. The generated bill is then delivered to the customer via e-mail or regular mail at the customer's physical address. Such manual process of reading, entering the energy data into the cloud system and delivering the bill is cumbersome, inefficient, and exposed to human errors. Further, when using the cloud system, there are recurring charges, e.g., for feeding the energy consumption data to the cloud system, storing the energy consumption data, and using the cloud system to, e.g., compute charges based on the energy consumption data, billing charges specific to each customer and billing cycles, sort the energy consumption data and computed charges, and generate bills for each customer. In addition, using the cloud system for manual entry, storage and generation of bills requires a continuous connectivity to the cloud system, a remote server, and/or Internet, which can become a problem where the connection may be lost or difficult to obtain.

A simple mechanism for automatic reading of periodic energy consumption for a specific customer or area, automatic generating a bill and usage data based on energy consumption data obtained from the automatic reading, and communicating the bill and usage data directly to the specific customer without manual intervention may be helpful.

There is room for improvement in energy metering and billing devices.

SUMMARY OF THE INVENTION

These needs, and others, are met by at least one embodiment of the disclosed concept in which an intelligent electric meter includes: metering components for measuring energy consumption by one or more devices used by a customer in a building, where the customer includes a single use tenant, a multi-use tenant, or a building owner; a controller electrically coupled to the metering components, the controller structured to control operations of the metering components and receive energy consumption data based on the measured energy consumption from metering components; a software device electrically coupled to the controller and structured to instruct the controller to monitor the energy consumption data, calculate energy consumption charges for the customer based at least in part on the energy consumption data, and generate a bill and energy usage data for a predefined period; and a communication device electrically coupled to the controller and the software device and structured to transmit the bill and energy usage data to the customer via a defined communications channel.

In accordance with an example embodiment of the disclosed concept, a gateway within a local area network (LAN) and communicatively coupled to a cloud system, and an intelligent electric meter located within the LAN and electrically coupled to the gateway, the intelligent electric meter including: metering components for measuring energy consumption by one or more locations or specified areas used by a customer in a building, where the customer includes a single use tenant, a multi-use tenant, or a building owner; a controller electrically coupled to the metering components, the controller structured to control operations of the metering components and receive energy consumption data based on the measured energy consumption from metering components; a software device electrically coupled to the controller and structured to instruct the controller to monitor the energy consumption data, calculate energy consumption charges for the customer based at least in part on the energy consumption data, and generate a bill and energy usage data for a predefined period; and a communication device electrically coupled to the controller and the software device and structured to transmit the bill and energy usage data to the customer via a defined communications channel, where the gateway is structured to receive the energy consumption data from the intelligent electric meter, aggregate the energy consumption data, calculate the energy consumption charges for the customer based at least in part on the energy consumption data, and generate the bill and energy usage data for the customer for the predefined period, and the cloud system stores one or more of historical energy consumption data, billing charges, billing history, and billing cycles associated with the customer.

In accordance with an example embodiment of the disclosed concept, a method for monitoring energy using an intelligent electric meter, includes monitoring energy consumption by one or more locations or specified areas used by a customer in a building, measuring automatically the energy consumption for a predefined period, generating automatically a bill and energy usage data for the customer for the predefined period, and transmit the bill and energy usage data to the customer in a defined communication channel.

BRIEF DESCRIPTION OF THE DRAWINGS

A full understanding of the invention can be gained from the following description of the preferred embodiments when read in conjunction with the accompanying drawings in which:

FIG. 4 is a block diagram of an intelligent electric meter in accordance with an example embodiment of the disclosed concept;

FIG. 5 is a flowchart for a method of monitoring energy in accordance with an example embodiment of the disclosed concept.

DESCRIPTION OF THE PREFERRED EMBODIMENTS

Figure 1:
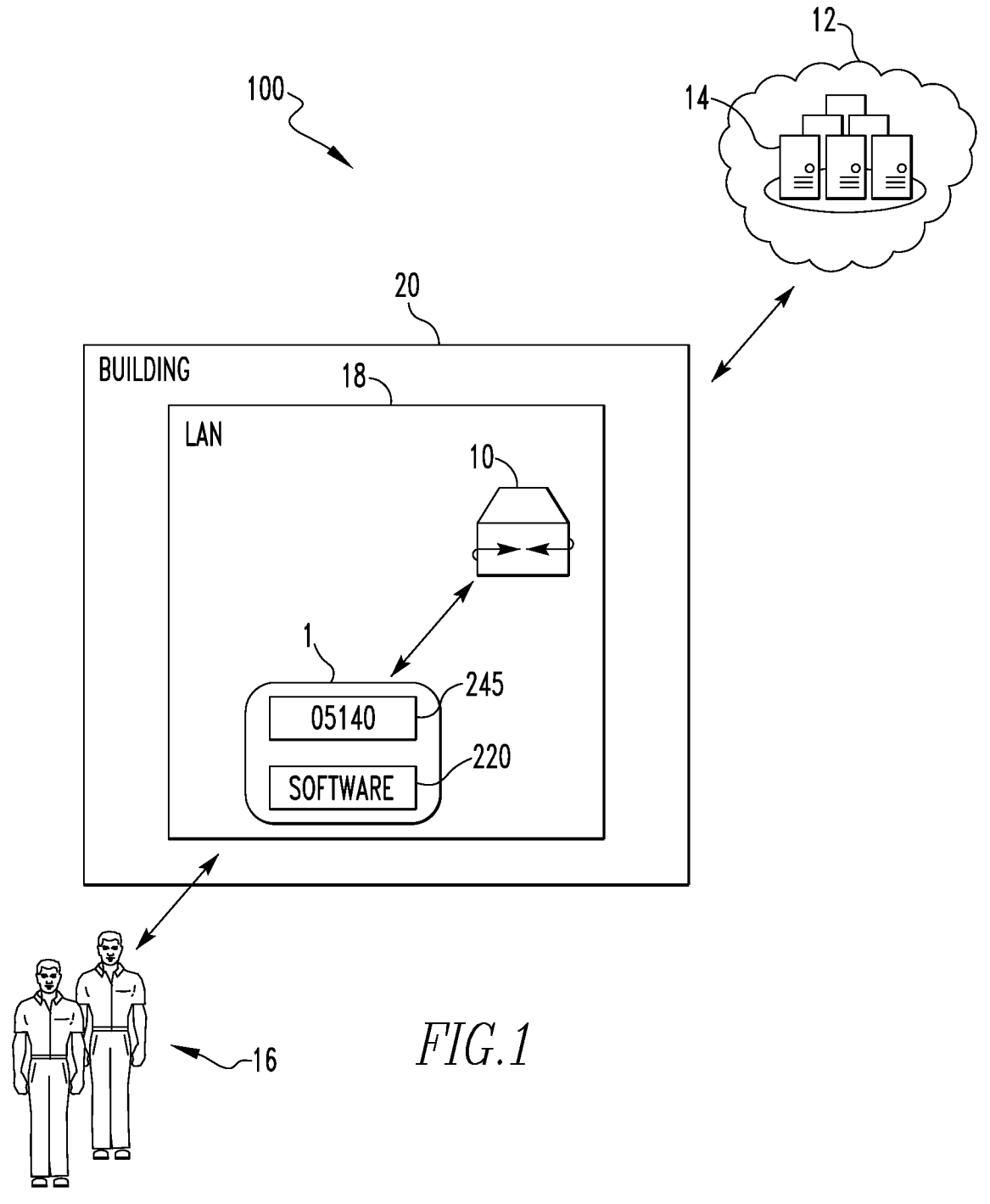
FIG. 1 is a schematic diagram of an energy monitoring system in accordance with an example embodiment of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, the term "number" shall mean one or an integer greater than one (i.e., a plurality).

Conventional electric metering and billing systems require that an inspector or agent of a building owner, a building management company, a utility provider, etc., to visit the building and read individual meters for particular customers, return to his or her office, enter the readings into a system (e.g., a cloud system) which stores the entered data, calculates amounts to be billed to each customer (e.g., office tenants, plant tenants, factory tenants, etc.) based at least in part on billing charges and billing cycles, generates bills for each customer and causes delivery of the bills to the customers via e-mail or regular mail. However, the manual reading of energy consumption and processing the energy consumption data, remote generation of bills based on the data by the cloud system, and manual delivery of the bills are cumbersome, inefficient, and expensive. In addition, having the cloud system to generate bills and energy consumption data may cause inconvenience and dissatisfaction to those customers who desire to view and analyze their energy consumption data on site without having to access the cloud system so as avoid recurring charges associated with such access.

Example embodiments of the disclosed concept address these issues. For example, an energy monitoring device (e.g., a single-point intelligent electric meter, a multi-point intelligent electric meter, a gateway, a relay, etc.) in accordance with the present disclosure may automatically measure energy consumed at each energy consumption point, calculate the charges based on billing charges and billing cycles, and generate bills and energy usage data for a specific customer or area on site. As such, the energy monitoring device in accordance with the present disclosure not only provides flexibility in reading and generating bills for each customer without having to dispatch an agent or inspector for manual reading, but also reduces recurring charges associated with using the cloud system, e.g., for storing the periodic energy consumption data in the cloud data system, calculating the billing amounts for each customer, generating the bills for each customer, etc.

FIG. 1 is a schematic diagram of an energy monitoring system 100 in accordance with an example embodiment of the disclosed concept. The energy monitoring system 100 includes an intelligent electric meter 1, a gateway (e.g., an edge gateway) 10, a cloud system 12, a cloud database 14 within the cloud system 12, customers (e.g., office tenants, factory tenants, etc.) 16, and a local area network 18 interconnecting the intelligent electric meter 1 and the gateway 10 within a building premise 20 in which the customers 16 consume energy. The cloud system 12 may be, for example, a utility provider cloud, and the cloud database 14 may be, e.g., a billing data storage. The customers 16 may include, for example, a single use customer, a multi-use customer, or a building or facility owner.

The intelligent electric meter 1 and the gateway 10 are electrically coupled to each other and may include a processor and a memory (e.g., a processor 210 and a memory 215 as described with reference to FIG. 4). The memory may include a software device (e.g., a software 220 as described with reference to FIG. 4) via which the intelligent electric meter 1 and the gateway 10 can be configured with parameters such as time duration, a storing medium, a communication channel for exporting bills or displaying amount of energy consumed, billing function, and historic data management necessary for generating and transmitting the bills to the customers. The software may be present in the cloud system 12 and can be installed or loaded to the intelligent electric meter 1 and the gateway 10 from the cloud system 12. The software device is capable of monitoring energy data for one or more devices (e.g., office equipment, printers, etc.) and operate continuously on the intelligent electric meter 1 and the gateway 10. As such, the intelligent electric meter 1 and the gateway 10 are configurable via the cloud system 12 or locally, and may be reconfigured as customers or circumstances change. For example, the building owner or the management company may configure a customer ID, a phone number, a customer e-mail address, billing cycle, etc. into the intelligent electric device 1 and the gateway 10 at an inception of a lease, using the cloud system commands (e.g., operating commands under Microsoft™, Google™, etc.). When the customer associated with the customer ID, the phone number, etc., moves out and a new customer moves into the building, the building owner or the building management company may reconfigure the intelligent electric meter 1 and the gateway 10 with the new customer data. The configured information may be stored in intelligent electric meter 1 or the gateway 10. The intelligent electric meter 1 and the gateway 10 are capable of calculating billing charges for a billing cycle for specific customers, generating bills and usage statistics for the specific customers, and transmitting the bills directly to the customers 16 via defined communication channels (e.g., an authorized e-mail transmission, a text message to a customer phone, etc.) without manual intervention.

Figure 2:
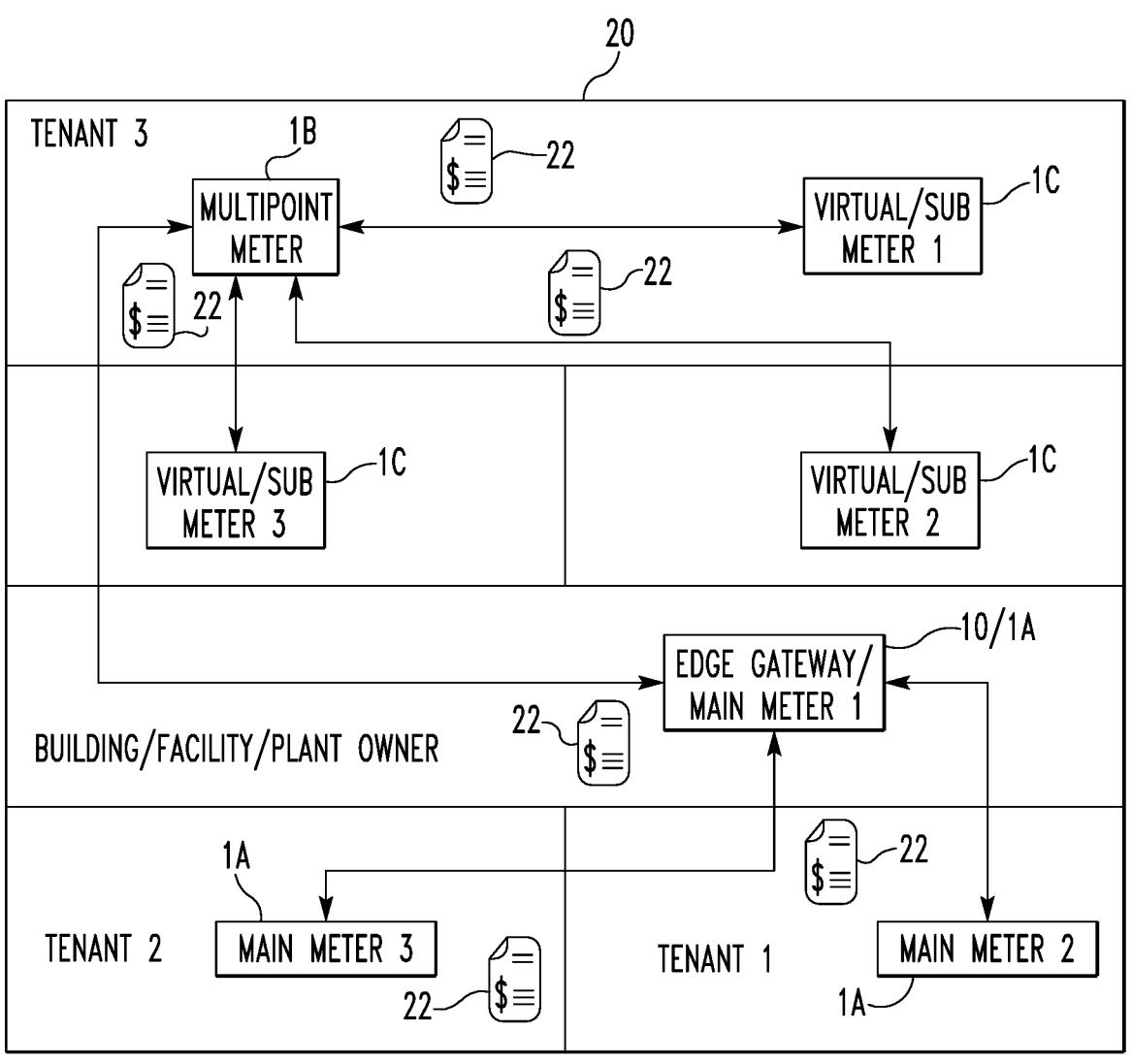
FIG. 2 is a schematic diagram of energy monitoring of an example building in accordance with an example embodiment of the disclosed concept.

The intelligent electric meter 1 may be a single-point intelligent electric meter (e.g., a main meter 1A as shown in FIG. 2) and a multi-point intelligent electric meter (e.g., a multi-point meter 1B as shown in FIG. 2). The single-point intelligent electric meter 1A may monitor energy consumption for a basic energy consumption area used by a single use customer (e.g., an office tenant whose electric consumption is basic such as lights, AC, heating, basic computing devices, basic communications devices, etc.). The single-point intelligent electric meter 1A is structured to automatically measure the energy consumption of the office tenant for a pre-defined period (e.g., a month), calculate charges for a pre-defined billing cycle, generate a bill for the office tenant 16 for the pre-defined billing cycle. The single-point intelligent electric meter 1A may transmit the bill and usage statistics to the office tenant directly (e.g., via e-mail or any other appropriate communication channels defined or authorized by the tenant 16). Alternatively, the single-point intelligent electric meter 1A may submit the energy consumption data to the gateway 10 within the LAN 20. The gateway 10 may receive the energy consumption data, calculate the charges for the billing cycle, and generate a bill and energy usage data for the billing cycle all locally, without using the cloud system 12. The gateway 10 may then transmit the bill and energy usage data to the office tenant directly.

A multi-point intelligent electric meter may be electrically coupled to a plurality of virtual submeters which monitor a plurality of specified area incurring non-basic energy consumption by a multi-use customer (e.g., a manufacturing company, a printing company, a research company, etc.) who may be leasing one or more floors of the building. The multi-point intelligent electric meter 1B is structured to receive energy consumptions of multiple equipment via a plurality of virtual/sub meters monitoring energy consumption of the plurality of specified areas. A virtual/sub meter may refer to a virtual meter, a sub meter that is virtual, or a virtual submeter, and is referred to as a virtual submeter hereafter. Some examples of virtual submeters 1C are shown in FIG. 2. A virtual submeter may sense energy consumption by one or more pieces of equipment used at the plurality of specified areas leased by a multi-use customer, e.g., a printing company tenant 16. For example, the printing company tenant may have some equipment printing booklets in one area and other equipment printing magazines in another area. The virtual submeters 1C may be configured to sense energy consumption by the specific equipment and transmit the sensed energy consumption to the multi-point intelligent electric meter 1B. Upon receiving the energy consumption data from the virtual submeters 1C, the multi-point intelligent electric meter 1B may aggregate the received energy consumption data measured by each virtual submeter 1C, calculate the billing charges for the printing company tenant, and generate and transmit one total bill with an itemized breakdown of energy consumption data by each equipment to the printing company tenant 16. As such, the multi-use customer may analyze the bill with a breakdown of energy usage for each equipment, and determine how much each equipment or a department is consuming without having to access the cloud system 12 and avoiding the recurring charges associated accessing the cloud system 12. In some examples, the multi-point intelligent electric meter 1B may generate and transmit a plurality of bills, each bill corresponsive to each specified area. Here, the multi-use customer receives a separate bill for each piece of group of equipment and may also compare and analyze each of the bills and how much each piece of or group of equipment or a department is consuming without having to access the cloud system 12 and avoiding the recurring charges associated accessing the cloud system 12. In some examples, the multi-point intelligent electric meter 1B may neither calculate the charges nor generate the bill and energy usage data, but transmit the energy consumption data received from the virtual submeters 1C to the gateway 10. The gateway 10 may in turn aggregate the received energy consumption data measured by each virtual submeter 1C, calculate the billing charges, and generate and transmit a bill with an itemized breakdown of energy consumption data by each equipment to the printing company tenant.

The gateway 10 is structured to monitor the energy consumption of the entire building 20 and is electrically coupled to the single-point intelligent electric meter 1A and the multi-point intelligent electric meter 1B located within the LAN 20. The gateway 10 may be a device (e.g., a router, a switch, or any computing device) that may act as a network entry point for, e.g., the intelligent electric meter 1 for communicating with the cloud system 12. In some examples, the intelligent electric meter 1 may communicate directly with the cloud system 12 without the gateway 10. The gateway 10 is communicatively coupled to the cloud system 12 and transmits the energy consumption data and bills for each customer for storage in the cloud database 14 using via wired or wireless communications technologies, e.g., LTE, A-LTE, Wi-Fi, New Radio, etc.

As previously stated, the gateway 10 receives energy consumption data from the single-point intelligent electric meter 1A and the multi-point intelligent electric meter 1B. Upon receiving the energy consumption data, the gateway 10 may aggregate the received energy consumption data, calculate the energy consumption charges based on the energy consumption data, and generate a bill for a predefined period (e.g., a monthly billing cycle). The gateway 10 may generate one bill for the multi-use customer with an itemized breakdown of energy consumption data by each equipment to the printing company tenant. In some examples, the gateway 10 may generate bills at individual intelligent electric meter 1. In some examples, the gateway 10 may generate a plurality of bills, each bill covering one floor of a plurality of floors of the building 20.

Conventionally, the gateway 10 receives energy consumption data measured by one or more electric meters, aggregates the energy consumption data, and feeds the aggregated data to the cloud system 12. However, in the present disclosure, while the gateway 10 may still transmit historic usage data, billing data, usage data of customers to the cloud system 12 for storage, the gateway 10 may process the aggregated data, calculate the charges, and generate and transmit bills and usage statistics for specific customers—all locally, without having to connect to the cloud system 12, a remote server, or Internet.

Therefore, the embodiments in accordance with the present disclosure provide automatic reading of energy consumption data and automatic generation of bills to specific customers at the intelligent electric meter 1 itself or at the gateway 10 without manual intervention or continuous connectivity to the cloud system 12, a remote server, or Internet. Such automatic reading and generating bills on site or locally offers much needed flexibility, efficiency, and cost-savings to the building owners, the building management company, and to the tenants.

FIG. 2 is a schematic diagram of energy monitoring of an example building 20 in accordance with an example embodiment of the disclosed concept. In the example embodiment shown in FIG. 2, the building 20 has four floors, each floor leased to one or more tenants. Each floor includes at least one of a main meter 1A (also referred to as main meters 1,2,3), a multi-point meter 1B, a virtual submeter 1C (also referred to as virtual submeters 1,2,3), or a gateway 10. The main meter 1A is a single-point intelligent electric meter as described with reference to FIG. 1, and monitors energy consumption by a single-point tenant. The multi-point meter 1B is a multi-point intelligent electric meter as described with reference to FIG. 2, and monitors energy consumption at multi-points (e.g., offices, areas, equipment, etc.). The multi-point meter 1B may receive energy consumption measurements from each of multi-points from respective virtual submeters 1,2,3 and generate an individual bill corresponsive to respective virtual submeter reading or a total bill for the multi-point tenant with an itemized energy usage statistics for the specified office. A virtual submeter 1C monitors a specified office including a specific equipment incurring non-basic energy consumption. The virtual submeter 1C senses the energy consumption by a specific equipment in a specified office and transmits the sensed energy consumption data to the multi-point meter 1B. The virtual submeter 1C generally does not calculate billing charges or generate bills. The gateway 10 is electrically coupled to the main meters 1A and multi-point meter 1B and structured to receive energy consumption data from the main meters 1A and multi-point meter 1B. Upon receiving the energy consumption data, the gateway 10 may aggregate the received energy consumption data, and calculate the electric charges, sorts the charges and energy usage statistics, and generates bills for the customers (e.g., tenants 1,2,3 and building owner) if the main meters 1A or multi-point meter 1B has not already calculated the charges and generated bills.

In FIG. 2, Floor one of the building 20 is leased to tenant 1 and tenant 2, who have basic energy consumption needs (e.g., for lights, ACs, heater, etc.). The main meter 2 and main meter 3 are used for measuring energy consumption and billing of tenant 1 and tenant 2, respectively. The main meter 2 and main meter 3 are capable of automatically measuring the energy consumption and generating bills 22 for tenant 1 and tenant 2, respectively, on site (e.g., at the main meter itself) without a need of any parent (e.g., the gateway 10). Floor two of the building 20 is occupied by the building owner (e.g., a plant owner, facility owner, etc.) and includes main meter 1, which automatically measures energy consumption and generates a bill 22 for Floor two allocated to the building owner. A gateway 10 is also located on Floor two and is used to monitor the energy consumption of the entire building 20. The gateway 10 has connection to the main meters 1,2,3 and a multi-point meter 1B. The gateway 10 is capable of receiving energy consumption data from the main meters 1,2,3 and the multi-point meter 1B and generating bills for each entity (e.g., tenant 1, 2, 3 and the building owner) of the building 20 separately. The gateway 10 may generate bills for offices (e.g., for tenants 1 and 2, offices utilizing specific equipment of tenant 3, and the building owner). The gateway 10 may generate bills for each floor, e.g., a bill based on readings from main meter 2 and 3 for Floor one, a bill based on readings from main meter 1 for Floor two, a bill based on readings from sub meters 2 and 3 for Floor three, and a bill based on readings from submeter 1 for Floor four. In some examples, the gateway 10 may generate bills for individual meters. Floors three and four of the building 20 are leased to tenant 3, e.g., a manufacturer of a chip maker or a research company. Tenant 3 may use Floor three for a designing area for which the virtual submeter 2 is used to sense energy consumption and a testing space for different parameters of the chips for which the virtual submeter 3 is used to sense energy consumption. Tenant 4 may use Floor four for fabrication laboratory area, for which the virtual submeter 1 is used to measure energy consumption. The virtual submeters 1,2,3 are electrically coupled to the multi-point meter 1B and transmits respective energy consumption data to the mutli-point meter 1B, which is capable of generating a bill 22 for each virtual submeter 1,2,3 or a total bill for Tenant 3. In some examples, the multi-point meter 1B may transmit the energy consumption data it received from each virtual submeter 1,2,3 to the gateway 10, which may then aggregate and process the data locally, calculate charges for the billing cycle, and generate and transmit bills and energy usage statistics to the customers.

Figure 3:
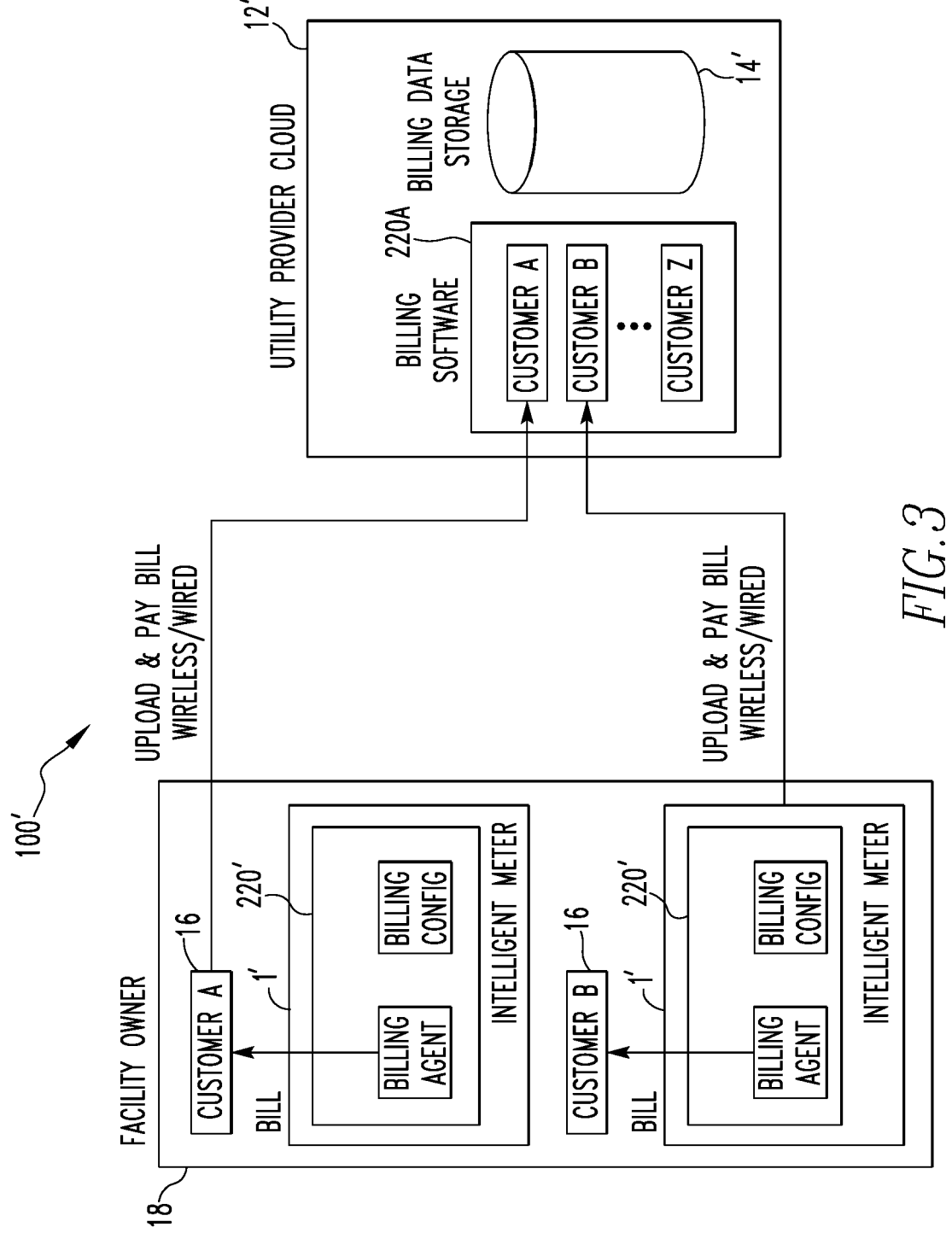
FIG. 3 is a block diagram of an energy monitoring system in accordance with an example embodiment of the disclosed concept.

FIG. 3 is a block diagram of an energy monitoring system 100' in accordance with an example embodiment of the disclosed concept. The energy monitoring system 100' is similar to the energy monitoring system 100 of FIG. 1 and includes an intelligent electric meter 1', a utility provider cloud 12', customers (e.g., office tenants, factory tenants, etc.) 16, and a local area network (LAN) 18 encompassing the intelligent electric meters 1'. The intelligent electric meters 1' and/or the LAN 18 may be communicatively coupled to the utility provider cloud 12' via wired or wireless communications technologies. For example, customer A locally (e.g., via a gateway) uploads the data to his/her account in the utility provider cloud 12' and pays the bill via wired or wireless communications technologies. In another example, customer B directly uploads the data directly from the intelligent meter 1' that covers the locations or specified areas used by customer B to his/her account in the utility provider cloud 12' and pays the bill via wired or wireless communications technologies. The utility provider cloud 12' may include a billing data storage 12' and a billing software 220A similar to software 220 of FIG. 1. The billing software 220A processes billing and energy usage data of specific customers, and the billing data storage 12' stores all uploaded billing and energy usage data as well as other relevant data (e.g., historical billing statistics, historical energy usage statistics, etc.).

The intelligent electric meter 1' is similar to the intelligent electric meter 1 of FIGS. 1, 2, and 4, and includes software 220' with billing configuration and billing agent capabilities. The intelligent electric meter 1' is structured to operate and perform billings in one of two modes: (1) an offline mode in which billing gets processed on local intelligent electric meters 1' only and bills are provided to the facility owner and/or customers 16; and (2) an online mode in which billing and energy data is uploaded to the utility provider cloud 12' and billing may be done locally and on the utility provider cloud 12'. In some examples, the customer 16 may go online but because of, e.g., network limitation, the customer 16 may opt in for offline billing. As such, the customer 16 may forward or push data to the utility provider cloud 12' manually by exporting the data from local devices (e.g., the intelligent electric meter 1') during offline and pushing to cloud where the customer 16 has connectivity (e.g., wired or wireless) during online. Upon loading the billing data to the utility provider cloud 12', the customer 16 may pay his/her bills via the utility provider cloud 12'. In FIG. 3, the billing agent is included in software 220' and is automatically configured to transmit bills generated locally to the customer 16. However, the billing agent may be external to software 220' and transmit the bills to the customers 16 in an authorized communication channel (e.g., email, text, etc.).

FIG. 4 is a block diagram of an intelligent electric meter in accordance with an example embodiment of the disclosed concept. The intelligent electric meter may be an intelligent electric meter 1 (e.g., a single-point intelligent electric meter or a multi-point intelligent electric meter) as described with reference to FIG. 1. The intelligent electric meter 1 may include, but not limited to, metering elements 205, processor 210, memory 215, software 220, transceiver 225, antenna 230, I/O controller 235, display 240, a battery 245, and a meter communications manager 250. These components may be in electronic communication via one or more buses (e.g., bus 255). The intelligent electric meter may communicate with other devices, e.g., a gateway 10 as described with reference to FIGS. 1 and 2 via wired or wireless communications technologies, e.g., Wi-Fi, Bluetooth™, radio frequency identification, near field communications. In some examples, the intelligent electric meter may communicate with the cloud system via wireless communication technologies, e.g., LTE, A-LTE, Wi-Fi, New Radio, etc.

The metering elements 205 are structured to monitor and/or measure electric usage by a specific customer in a building premise. In examples where an electronic meter is used, the metering elements 205 may include a metering engine which is provided with inputs including voltage and current, an analog to digital converters for digitizing all the inputs, a digital signal processor for calculating energy consumption in kilowatt per hour (kWh), a real time clock, etc. The metering elements 205 may be electrically coupled to a display (e.g., a liquid crystal display) 240 for displaying the energy consumption for a specific customer. The metering elements 205 may be also electrically coupled to a power source (e.g., a battery 245). The battery 245 may be a nonrechargeable battery (e.g., an alkaline battery) or a rechargeable battery (e.g., a lithium-ion battery), and act as a primary power source or a backup battery for the metering elements 205 when an AC power supply is disrupted. In examples where an electromechanical meter is used, the metering elements include a current coil, a voltage coil, and a permanent magnet (not shown) for producing fluxes at each coil but with a 90 degree phase angle, causing a nonmagnetic metal disc to rotate, and creating forces to the rotating disc such that the rotation of the metallic disc is proportional to the energy usage. The metering elements 205 are electrically coupled to the processor 210 for controlling operation and functionality of each metering element 205.

The Processor 210 may include an intelligent hardware device (e.g., a general-purpose processor, a DSP, a central processing unit (CPU), a microcontroller, an ASIC, an FPGA, a programmable logic device, a discrete gate or transistor logic component, a discrete hardware component, or any combination thereof). Processor 215 may be configured to execute computer-readable instructions 220 stored in a memory 215 to perform various functions.

Memory 215 may include random access memory (RAM) and read only memory (ROM). The memory 215 may store computer-readable, computer-executable software 220 including instructions, that when executed, cause the processor 210 to perform various functions described herein. In some cases, the memory 215 may contain, among other things, a basic input/output system (BIOS) which may control basic hardware or software operation such as the interaction with peripheral components or devices.

Software 220 may include code or algorithm to implement aspects of the present disclosure. For example, software 220 may include instructions for the processor 210 to perform at least: monitor continuously electric usage by a customer in a building premise, automatically measure the electric usage for a predefined period, e.g., a monthly billing cycle, automatically generate a bill and electric usage data for the predefined period, and transmit the bill and electric usage data to the customer in a defined or authorized communications channel, e.g., an e-mail transmission. Software 220 may be loaded and/or updated via the cloud system using the cloud system commands (e.g., Microsoft™, Google™ operating commands) to the memory 215 of the intelligent electric meter. Software 220 may also be installed or loaded to a memory of a gateway to include instructions for a processor within the gateway to perform at least: monitor one or more intelligent electric meters coupled to the edge gateway, receive energy consumption data measured by the one or more intelligent electric meters, aggregate the received energy consumption data, calculate charges for each specific customer for a pre-defined period, and generate and transmit a bill and energy usage data to the customer via a defined or authorized communication channel.

Software 220 may be stored in a non-transitory computer-readable medium such as system memory or other memory. In some cases, the software 220 may not be directly executable by the processor 210 but may cause a computer (e.g., when compiled and executed) to perform functions described herein. The memory 215 may also include firmware embedded for implementing the operations of the intelligent electric meter. Transceiver 225 may communicate uni-directionally or bi-directionally, via one or more antennas 230, wired, or wireless links. For example, the transceiver 225 may represent a wireless transceiver and may communicate uni-directionally with a customer device, e.g., a smart phone, a laptop, or any other user device, to transmit a bill and energy usage data to a specific customer via wireless communications technologies. In another example, the transceiver 225 may communicate bi-directionally with another wireless transceiver, e.g., a cloud transceiver for receiving software updates and transmitting periodic energy consumption data of customers for storage in the cloud system. I/O controller 235 may manage input and output signals for the intelligent electric meter 1, inputting continuous energy consumption measured from the metering components 205 and outputting the bill and energy usage data to, e.g., the display 240 or transceiver 225 for transmission of the bill and energy usage data to a customer device, e.g., a phone via e-mail or texts.

The meter communications manager 250, or its components may be implemented in hardware, software executed by the processor 210, firmware, or any combination thereof. If implemented in software executed by the processor 210, the functions of the user device communications manager 250 may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform various communication functions, e.g., determining communication format (e.g., LTE, LTE-A, New Radio, etc.) in accordance with a defined or authorized communication channels, generating messages in the determined format to transmit a bill and usage generated by the software 220 to a specific customer, etc.

FIG. 5 is a flowchart for method 500 for monitoring energy in accordance with an example embodiment of the disclosed concept. The method 500 may be performed by an intelligent electric meter 1 or components therein as described with reference to FIGS. 1-4.

At 510, the intelligent electric meter may monitor continuously energy consumption by one or more locations or specified areas used by a customer in a building.

At 520, the intelligent electric meter may measure the energy consumption by the customer for a predefined period.

At 530, the intelligent electric meter may calculate energy charges based at least in part on the measured energy consumption.

At 540, the intelligent electric meter may generate automatically a bill and energy usage data for the customer for the predefined period.

At 550, the intelligent electric meter may transmit the bill and energy usage data to the customer in a defined communication channel.

Figure 6:
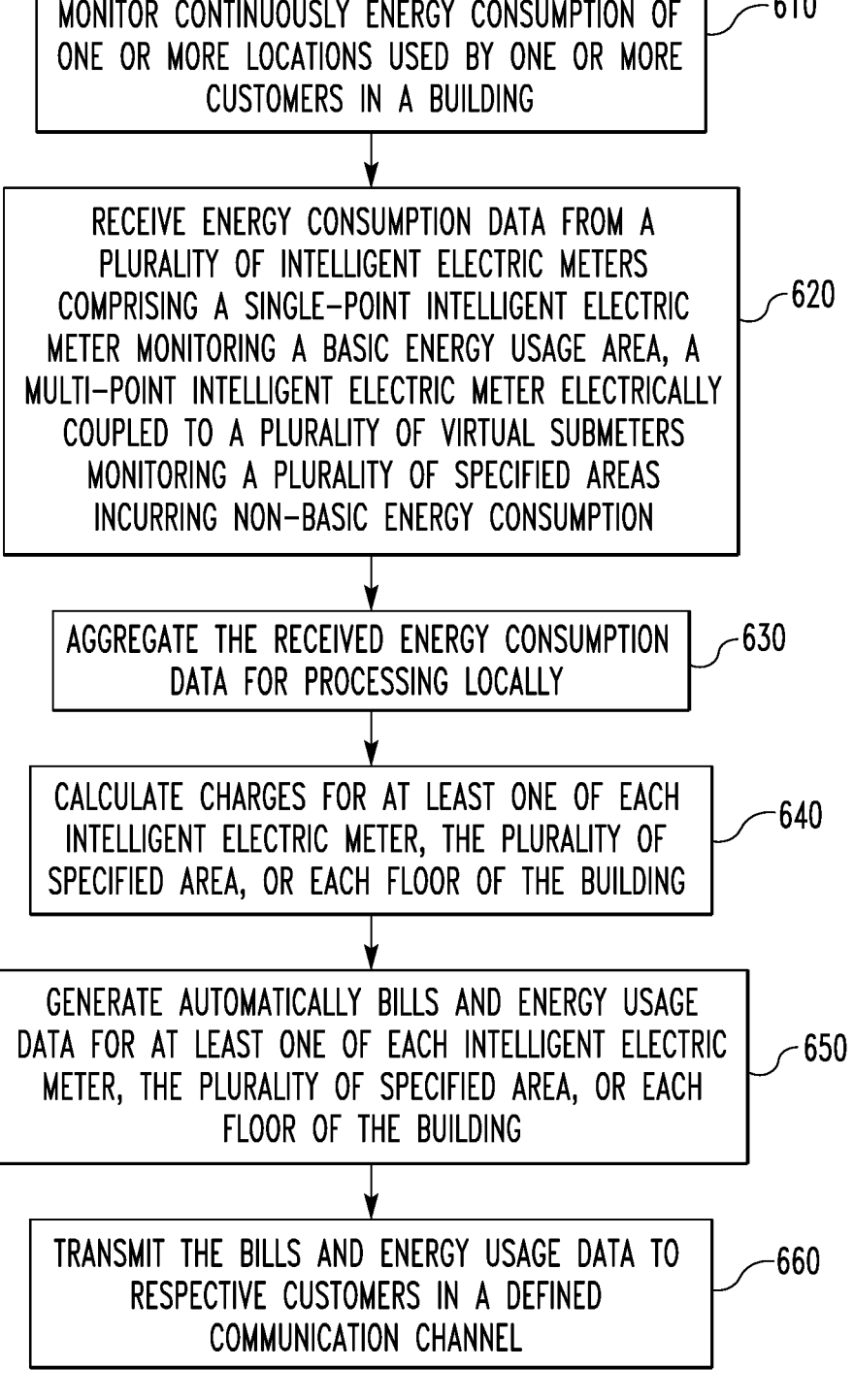
FIG. 6 is a flowchart for another method of monitoring energy in accordance with an example embodiment of the disclosed concept.

FIG. 6 is a flowchart for another method 600 for energy monitoring in accordance with an example embodiment of the disclosed concept. The method 600 may be performed by a gateway 10 or components therein as described with reference to FIGS. 1-2.

At 610, the gateway may monitor continuously energy consumption of one or more locations or specified areas used by one or more customers in a building.

At 620, the gateway may receive energy consumption data measured by a plurality of intelligent electric meters comprising a single-point intelligent electric meter monitoring a basic energy usage area, a multi-point intelligent electric meter electrically coupled to a plurality of virtual submeters monitoring a plurality of specified areas incurring non-basic energy consumption.

At 630, the gateway may aggregate the received energy consumption data for processing locally.

At 640, the gateway may calculate charges for at least one of each intelligent electric meter, the plurality of specified areas, or each floor of the building.

At 650, the gateway may generate automatically bills and energy usage data for at least one of each intelligent electric meter, the plurality of specified area, or each floor of the building.

At 660, the gateway may transmit the bills and energy usage data to respective customers in a defined communication channel.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A system for monitoring energy comprising:
a gateway within a local area network (LAN) and communicatively coupled to a cloud system;
an intelligent electric meter located within the LAN and electrically coupled to the gateway, the gateway being disposed externally and separately from the intelligent electrical meter, the intelligent electric meter comprising:
    a number of metering components for measuring energy consumption by one or more devices used by a customer in a building, wherein the customer comprises a single use tenant, a multi-use tenant, or a building owner;
    a controller electrically coupled to the metering components, the controller structured and configured to control operations of the metering components and receive energy consumption data based on the energy consumption measured by the metering components;
    a software device electrically coupled to the controller and structured and configured to instruct the controller to monitor the energy consumption data, calculate energy consumption charges for the customer based at least in part on the energy consumption data, and generate a bill based on the energy consumption charges and energy usage data based on the energy consumption data for a predefined period; and
    a communication device electrically coupled to the controller, wherein the software device is structured and configured to transmit the bill and energy usage data directly to the customer via a defined communications channel,
wherein the gateway is structured and configured to: (i) receive the energy consumption data from the intelligent electric meter, aggregate the energy consumption data, calculate the energy consumption charges for the customer based at least in part on the energy consumption data, and generate the bill and energy usage data for the customer for the predefined period, and (ii) receive additional energy consumption data for an additional customer from an additional electric meter located within the LAN and electrically coupled to the gateway, calculate additional energy consumption charges for the customer based at least in part on the additional energy consumption data, and generate and transmit directly to the additional customer a bill and energy usage data for the additional customer based on the additional energy consumption charges and the additional energy consumption data, the cloud system storing one or more of historical energy consumption data, billing charges, billing history, and billing cycles associated with the customer and the additional customer.

2. The system of claim 1, wherein the intelligent electric meter is structured to operate in one of two modes comprising an offline mode in which billing is processed locally on the intelligent electric meter, and an online mode in which the bill and energy usage data are uploaded to the utility provider cloud communicatively coupled to the intelligent electric meter and billing is processed locally and on the utility provider cloud.

3. The system of claim 2, wherein the intelligent electric meter is communicatively coupled to the utility provider cloud via wired or wireless communications technologies during the online mode.

4. The system of claim 1, wherein the software device is loaded from the cloud system to the intelligent electric meter via wireless communication technologies.

5. The system of claim 1, wherein the controller is configured with parameters comprising a time duration, the defined communication channel for transmitting the bill, a customer ID, a customer phone number, a customer e-mail address, a billing function, and historic data management.

6. The system of claim 5, wherein the controller is reconfigured via a local system or the cloud system based at least in part on a change of the customer using an area monitored by the intelligent electric meter.

7. The system of claim 1, wherein the building comprises a plurality of floors and the intelligent electric meter comprises at least one of: (i) a single-point intelligent electric meter monitoring a basic energy consumption area for the customer, or (ii) a multi-point intelligent electric meter electrically coupled to a plurality of virtual submeters monitoring a plurality of specified areas incurring at least one of non-basic energy consumption for the customer and basic energy consumption comprising energy consumption for lights, air conditioning devices, heaters, basic computing devices, or basic communications devices.

8. The system of claim 7, wherein the intelligent electric meter comprises the multi-point intelligent electric meter and the plurality of virtual submeters are structured to sense energy consumption in respective specified areas and transmit energy consumption data for the respective specified areas to the multi-point intelligent electric meter.

9. The system of claim 8, wherein the multi-point intelligent electric meter aggregates the energy consumption data received from the plurality of virtual submeters, calculates the energy consumption charges based on the received energy consumption data, and generates the bill and electric usage data for the predefined period, the bill comprising a plurality of separate bills, each separate bill corresponsive to one of the plurality of specified areas.

10. The system of claim 8, wherein the multi-point intelligent electric meter aggregates the energy consumption data received from the plurality of virtual submeters, calculates the energy consumption charges based on the received energy consumption data, and generates the bill and electric usage data for all of the plurality of specified areas.

11. The system of claim 7, the intelligent electric meter comprises a single-point intelligent electric meter and the the additional electric meter is a multi-point intelligent electric meter that is electrically coupled to a plurality of virtual submeters monitoring a plurality of specified areas, and wherein the gateway is structured to receive the energy consumption data from at least one of the single-point intelligent electric meter and the additional energy consumption data from the multi-point intelligent electric meter, aggregate the received energy consumption data, calculate the energy consumption charges based on the energy consumption data, and generate a plurality of separate bills and electric usage data, each separate bill and electric usage data corresponsive to each of the plurality of floors.

\* \* \* \* \*